(12) United States Patent
Gadlage et al.

(10) Patent No.: US 9,431,133 B2
(45) Date of Patent: Aug. 30, 2016

(54) DIGITAL TEST SYSTEM

(71) Applicants: Matthew Gadlage, Jasper, IN (US); Adam Duncan, Bloomington, IN (US)

(72) Inventors: Matthew Gadlage, Jasper, IN (US); Adam Duncan, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 658 days.

(21) Appl. No.: 13/908,470

(22) Filed: Jun. 3, 2013

(65) Prior Publication Data

US 2014/0330533 A1    Nov. 6, 2014

Related U.S. Application Data

(60) Provisional application No. 61/654,155, filed on Jun. 1, 2012.

(51) Int. Cl.
| | | |
|---|---|---|
| *G01R 31/26* | (2014.01) | |
| *G11C 29/56* | (2006.01) | |
| *G01R 31/319* | (2006.01) | |
| *G11C 11/412* | (2006.01) | |
| *G11C 29/50* | (2006.01) | |

(52) U.S. Cl.
CPC ......... *G11C 29/56* (2013.01); *G01R 31/31907* (2013.01); *G11C 11/4125* (2013.01); *G11C 2029/5002* (2013.01)

(58) Field of Classification Search
CPC ............................................... G01R 31/31712
USPC .......... 324/158.1, 501, 750.16, 754.23, 765; 702/120
See application file for complete search history.

(56) References Cited

U.S. PATENT DOCUMENTS

| 6,154,039 | A | * | 11/2000 | Wu | ...................... | G01R 31/311 |
|---|---|---|---|---|---|---|
| | | | | | | 324/754.23 |
| 2003/0189440 | A1 | * | 10/2003 | Barror | ................ | G01R 31/2851 |
| | | | | | | 324/750.16 |
| 2009/0261840 | A1 | * | 10/2009 | Erington | ............ | G01R 31/2882 |
| | | | | | | 324/501 |

* cited by examiner

*Primary Examiner* — Lam Nguyen
(74) *Attorney, Agent, or Firm* — Christopher A. Monsey

(57) ABSTRACT

A highly flexible, compact, lightweight, and portable testing system for use with radiation testing activities. The testing system is coupled to a device under test (DUT), which can be positioned in such a way that the top of the die package is exposed to the direct ion beam during radiation testing. A variety of sensors, onboard memory systems, programmable interfaces, onboard control systems, data output devices, and different types of interfaces are also provided which provide an ability to perform testing procedures while having a maximum ability to orient the DUT and perform a wide variety of testing currently unavailable.

6 Claims, 15 Drawing Sheets

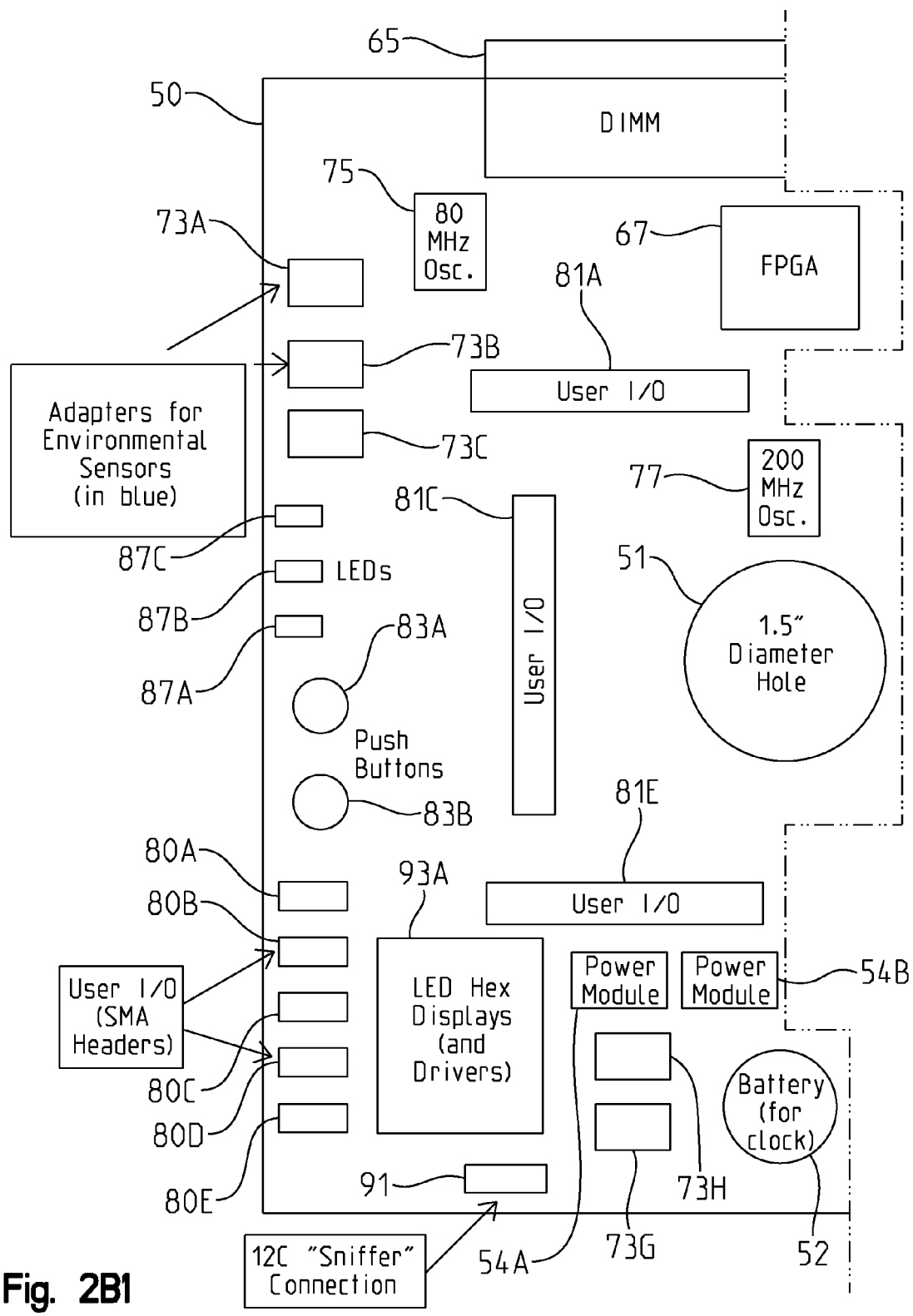
Fig. 2B1

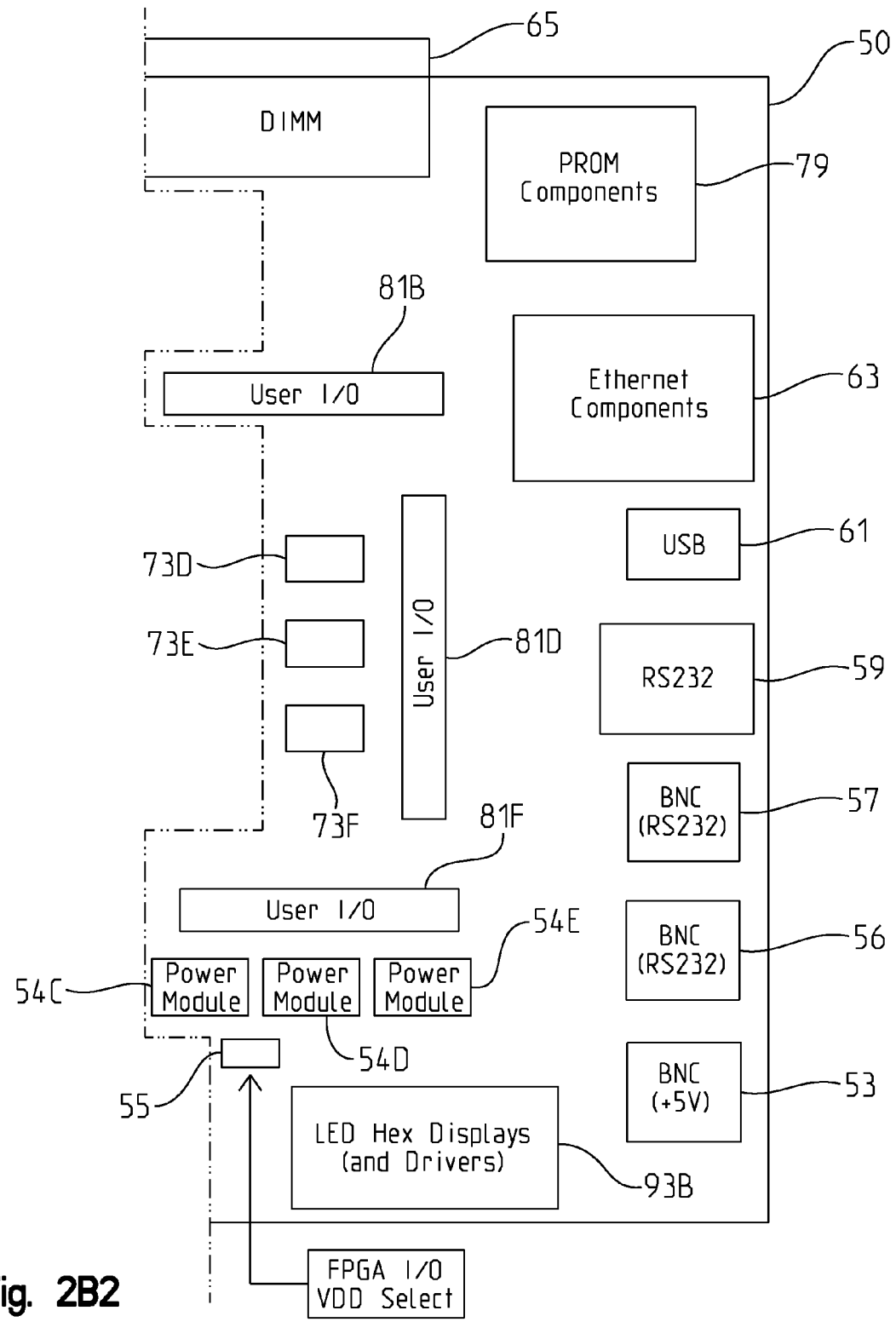
Fig. 2B2

```
GTP START 10:01:46
    □   16 MRAM Rev 2
    □   11/29/2011
    □   Write Data Pattern Aar-tc at 10:01:46 on 11/29/11
    □   Loop Type=RWR
    □   Temp=23C
    □   Freq=3MHz
    □   Bit Mode=DQ
    □   Rloop_W1=Y
    □   D15:0load=Aar-tc
    □   D15:0run=Aar-tc
    □   A19:0=ddd
    □   CLK=d
    □   CE_B=0
    □   WE=d
    □   OE=d
    □   RegEn=1
    □   Sleep=0
    □   FuseB=0
    □   Auto_Inc=0
    □   Overflow1=1
    □   Init=0
    □   Done=0
    □   X8=0
    □   A20=0
    □   ECC=N
    □   Test Mode=Y
    □   ISO_Mode=N
    □   TCLK=0
    □   TRSTB=1
    □   RCVR=Y
    □   NHTB=10
    □   NWEL=99
    □   NCAE=FF
    □   NCAI=04
    □   NLOP=FF                                          ⎬ 231
    □   RWR Loop Started at 10:01:47 ──────────── 233
    □   2ndR1 130C2 FE4F FECF 10:01:55 0007 D0B  ⎫
    □   2ndR2 130C2 FE4F FECF 10:01:55 0007 D0B  ⎬ 235
    □   2ndR3 130C2 FE4F FECF 10:01:55 0007 D0B  ⎭
    □   ......
```

Fig. 8A

- ......
- 1stR2  00120  FF7E  FFFE  10:01:56  0008  DOB ⎫
- 1stR3  00120  FF7E  FFFE  10:01:56  0008  DOB ⎬ 237
- 1stR1  00121  FF7E  FFFE  10:01:56  0008  DOB ⎭

-   DOB Errors=18B ⎫
- --SETs=002
- --SEUs=000
- --Stuck Bits=083
- ECB Errors=000
- ECF Errors=000
- POR Errors=000 ⎬ 239
- WIN Errors=000
- RSA Errors=000
- RSE Errors=001
- AIA Errors=000
- AIB Errors=000
- Heartbeats=000 ⎭
- Temperature = 23C ⎫ 241
- Humidity = 53% ⎭
- GTP STOP 10:02:00 ———— 243

Fig. 8B

DIGITAL TEST SYSTEM

CROSS-REFERENCE TO RELATED APPLICATIONS

The present application claims priority to U.S. Provisional Patent Application Ser. No. 61/654,155, filed Jun. 1, 2012, entitled "DIGITAL TEST SYSTEM," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

FIELD OF THE INVENTION

The present invention relates to a system and apparatus for performing functional tests on digital electronics such as memories, micro-processors, application specific integrated circuits (ASICS), and analog-to-digital converters (ADC). An embodiment of the invention is adapted for testing digital electronics in a radiation environment.

BACKGROUND AND SUMMARY OF THE INVENTION

Testing of digital components is currently performed with large, expensive machines. These testers are often extremely heavy and are not portable. Meanwhile, electronics that need to operate in radiation environments (i.e. space) often need to be tested while being exposed to radiation. To properly do this, it is imperative that the key components of the test system are not also exposed to radiation. Test systems used for radiation testing also need to be somewhat portable to enable shipping to the various radiation test facilities across the country. Due to radiation exposure, limitations on interface capabilities, cost, weight, lack of portability, and size, current digital test systems are not suitable for radiation testing for a wide variety of conditions, environments, and systems.

To achieve these and other advantages of the invention, as embodied and broadly described herein, the invention provides a digital test system for use in radiation testing activities. The digital test system is coupled to a device under test (DUT) and exposed to radiation source such as an ion beam. The radiation source can be placed on either side of the digital test system in order for the top of the die package of the DUT to be directly exposed to the radiation source. The digital test system can include sensors to monitor, display, and record various environmental factors. It also includes many user programmable aspects to control different aspects of the radiation testing that the user requires.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIG. 2B1 is a first detailed view of the exemplary digital test system of FIG. 2B;

FIG. 2B2 is a second detailed view of the exemplary digital test system of FIG. 2B;

FIGS. 8A and 8B are examples of exemplary outputs from the digital test system;

DETAILED DESCRIPTION OF THE DRAWINGS

The embodiments of the disclosure described herein are not intended to be exhaustive or to limit the disclosure to precise forms disclosed. Rather, the embodiments selected for description have been chosen to enable one skilled in the art to practice the disclosure.

Figure 1:
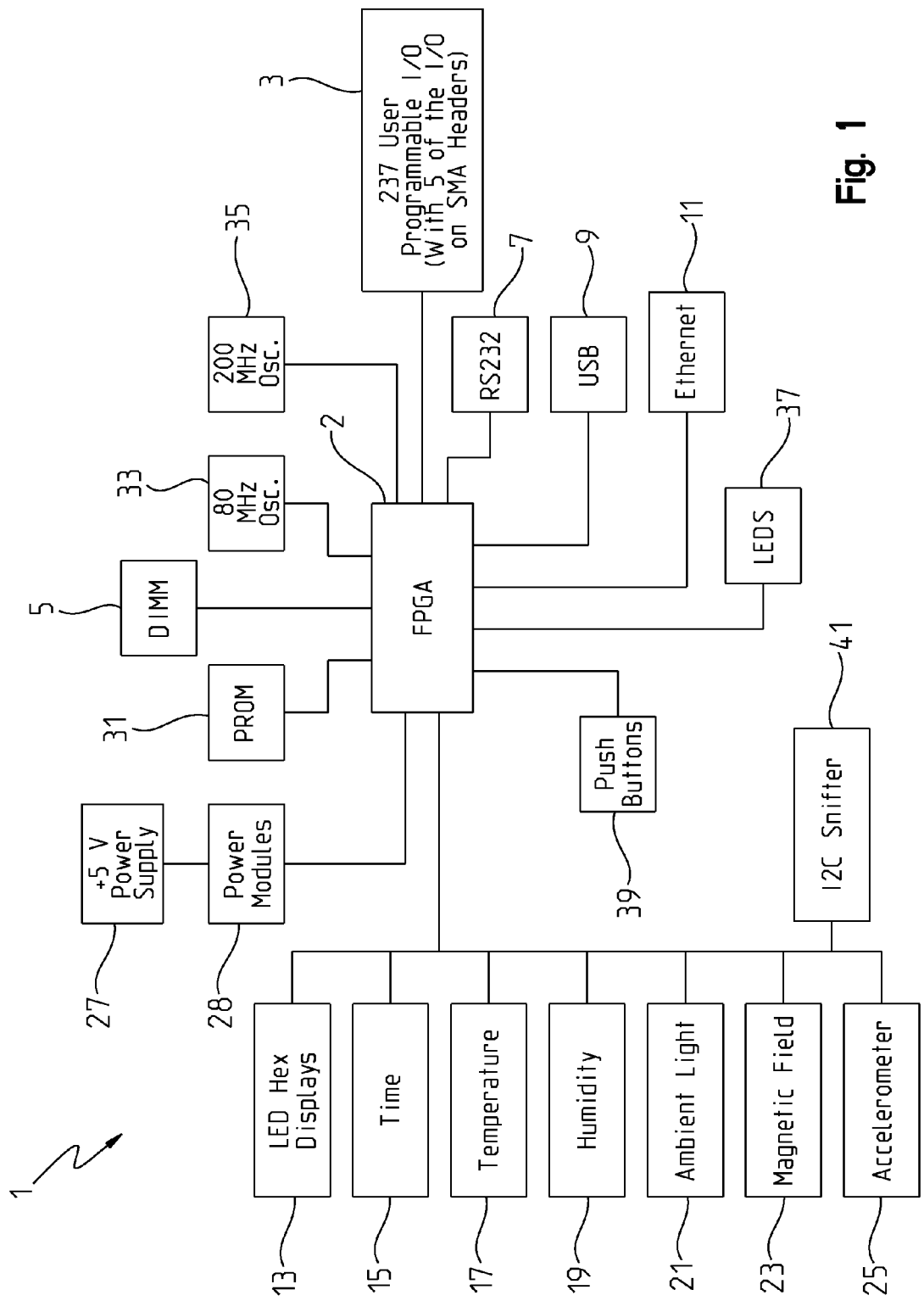
FIG. 1 is a block diagram of an illustrative digital test system showing various representative components, inputs, and outputs thereto.

FIG. 1 shows a block diagram for an illustrative system in accordance with one embodiment of a digital test system 1. A testing appliance (not shown) is provided e.g., a circuit board, that can be mounted in proximity to a radiation source and ancillary equipment. The exemplary test appliance mounts and interfaces with a device under test (DUT) that is portable and arranged to provide a means to avoid, minimizes or isolate test system components from radiation exposure, increase processing and performance speed as compared to existing test options. The exemplary test appliance has a structure which enables it to fit on top or in proximity to input/output structures placed on the digital test system circuit board. The exemplary embodiment is provided with FPGA 2 for controlling at least some of the various aspects of the digital test system which perform various test functions. An input/output (I/O) interface 3 is provided which can be used to couple with the DUT and other systems related to the digital test system. In this example, the I/O interface has 237 user programmable interface functions with five I/O interfaces having subminiature version A (SMA) connector. A SMA connector in this embodiment is a type of coaxial RF connector providing a minimal or small form factor connector interface for a coaxial cable with a screw type coupling mechanism. In this embodiment, the SMA connector has a 50Ω impedance. A dual in-line memory module (DIMM) 5 is coupled with the FPGA 2 to provide memory storage capacity. The DIMM 5 can store programs and also test results in this embodiment. Multiple computer system (e.g., personal computer) or external processing system interfaces are provided including an RS232 serial port 7, a universal serial bus (USB) port 9, and an Ethernet interface 11 are provided. In one example external processing system interfaces (e.g., 7, 9, 11) are coupled to the FPGA 2.

This embodiment also includes built-in measurement devices for a testing environment and areas in proximity to the testing appliance and/or DUT. These measurement devices are adapted to measure variables which can affect a testing of a DUT including temperature (17), humidity (19), ambient light (21), magnetic field(s) (23), acceleration (e.g., accelerometer) (25), and time (e.g., real-time clock) (15). The FPGA 2 can couple to the measurement devices (e.g., 15, 17, 19, 21, 23 and 25) through an interface bus 26 such as an inter-integrated circuit (I2C) bus system (e.g., a data and clock line system and associated I2C processing instructions configured on the FPGA 2). A measurement device bus interface sensor 41 can be included which permits testing or measurement of bus or interface activity between components connected to the interface bus 26. For example, the measurement device bus interface sensor 41 can include an I2C "Sniffer" connection. The sniffer connection permits monitoring of signals over the interface bus 26 in order to analyze data passing over the interface bus 26. For example, the bus interface sensor 41 can couple to an I2C "sniffer" to allow testing of I2C bus traffic (e.g., interface bus 26) and connections. Manual interfaces are also coupled to the FPGA 2, e.g., push buttons 39, to permit manual input of control inputs. For example, the push buttons 39 may be used for manual reset, functional test of the DUT, initiating a response from a system or combination of systems on the digital test system 1 or a device coupled to the digital test system 1. Light emitting diodes (LEDs) 37 are also included which permit programmable visible output capability to be employed in conjunction with the digital test system 1. In this embodiment, LEDs 37 are coupled to FPGA 2. For example, LEDs 37 could be used to display the progress of a test at predetermined points programmed into the FPGA 2. The LEDs 37 could be used to signify a DUT has passed a predetermined functional check test procedure programmed into the FPGA 2. In another example, LEDs 37 can signify a test mode. (e.g., a memory integrated circuit (IC) DUT is tested in an auto-increment mode and a normal mode such that an LED is lit in one mode and a different LED is lit in the other mode).

A programmable read only memory (PROM) system 31 is coupled to the FPGA 2 to permit data input into the FPGA 2. PROM system 31 includes a PROM IC chip (not shown). In this embodiment, the PROM system 31 stores the configuration data of the FPGA 2. The exemplary PROM system 31 includes a push button (not shown) coupled to the PROM 31 that reconfigures the FPGA 2 when pressed. The PROM system 31 also includes a FPGA programming interface connector (not shown) coupled to PROM IC chip.

The digital test system 1 as shown in FIG. 1 further includes a power supply interface 27. In the FIG. 1 example, power supply interface 27 is coupled to power modules 28 which in turn are coupled to the FPGA 2. However, power supply interface 27 also can provide power to a power bus (not shown) which is coupled to a variety of digital test system 1 components such as measurement devices (e.g., 15, 17, 19, 21, 25), power modules 28, a driver chip (not shown) associated with the RS232 serial port 7. Power modules 28 are shown in FIG. 1 to provide power to the FPGA 2. However, it must be understood that exemplary power modules 28 may also provide power to other components (e.g., 5, 7, 9, 11, 13, 15, 17, 19, 21, 23, 25, 31, 33, 35, 37) via one or more power buses (not shown). Exemplary power modules that are coupled to multiple components can be configured to provide different voltages to the other components of the exemplary digital test system 1. For example, one power module providing 2.5 volts can be coupled to the Ethernet interface 11. Another power module can be configured to 3.3 volts and can provide power to the PROM system 31.

The digital test system 1 as shown in FIG. 1 further includes an 80 megahertz (MHz) oscillator 33 and a 200 MHz oscillator 35 which are coupled to the FPGA 2. In this example the oscillators 33, 35 are used to drive clocking operations in the FPGA 2. In another embodiment of the digital test system 1, oscillators with different frequencies can be used. (e.g., 50 MHz and 100 MHz)

Exemplary Hexadecimal LED displays (HLD) 13 are also shown in FIG. 1. In one example, HLDs 13 are individually coupled to a different driver IC (not shown) which in turn couple to interface bus 26. In one embodiment, the FPGA 2 is configured display the temperature, humidity, and time from the measurement devices (15, 17, 19).

Figure 2A:
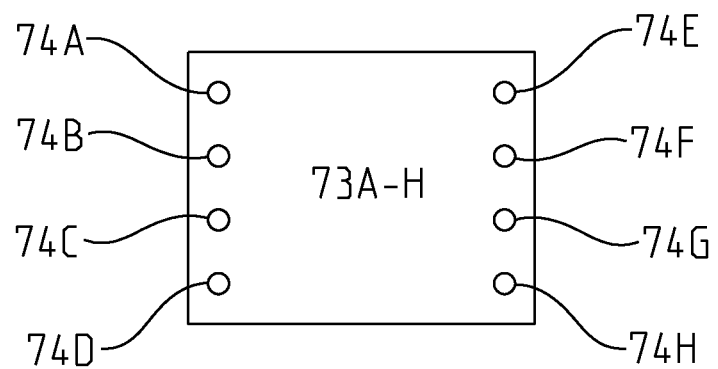
FIG. 2A is one example of pin designations for measurement interface devices which interact with various aspects of the digital test system.
Figure 2B:
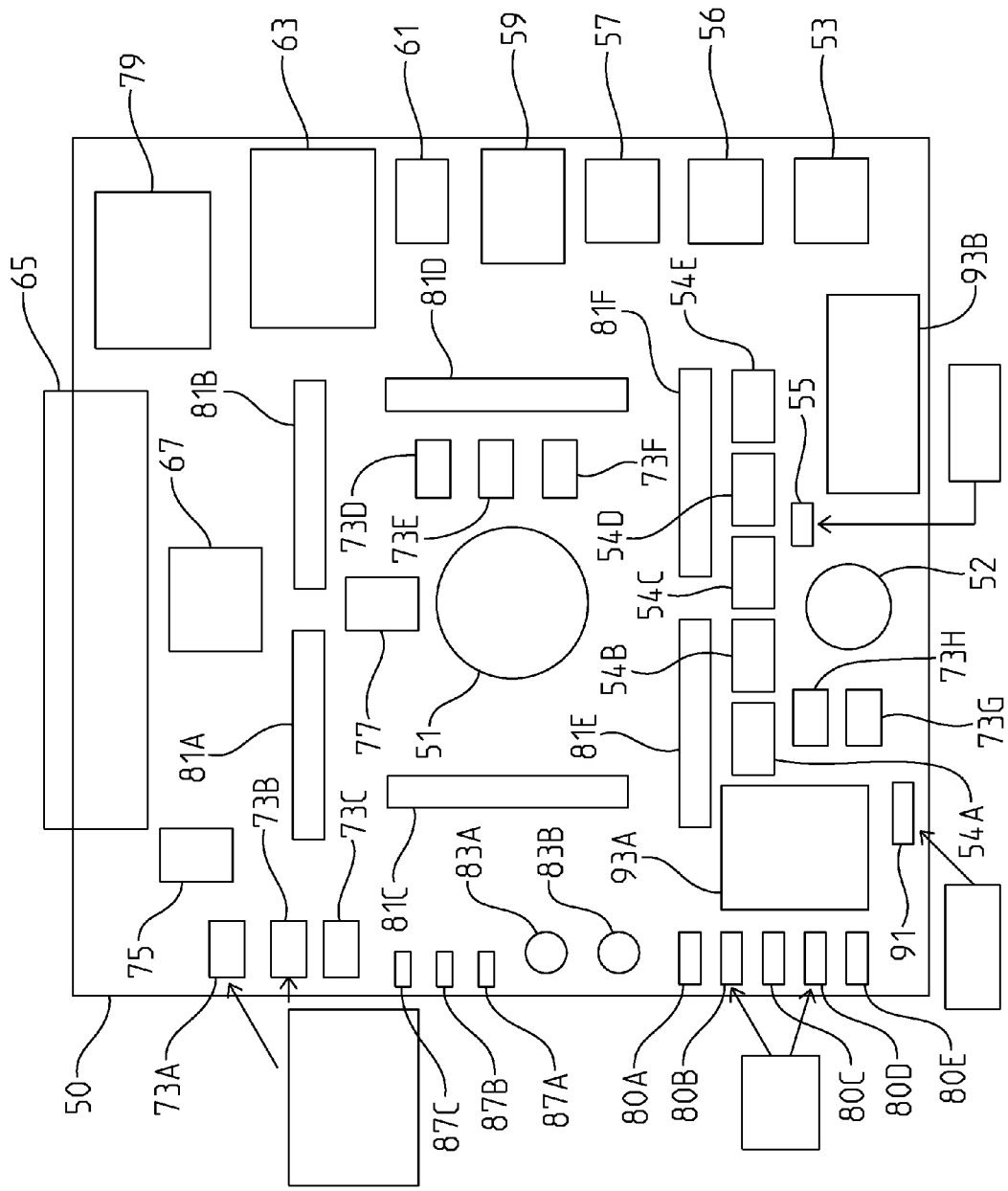
FIG. 2B shows an exemplary digital test system embodiment on a circuit board.

Referring to FIGS. 2B-2B2, an exemplary digital test system 1 includes a circuit board 50. In one embodiment circuit board 50 includes an aperture 51 in the circuit board 50. For example, the aperture 51 is formed in the center of a 10"×10" circuit board 50. The aperture 51 in combination with the other aspects of digital test system 1 permit placement of DUT on a DUT interface structure (not shown) that is coupled to user I/O structure (e.g., one or more of 81A-F). DUT can be placed on either side of the DUT interface structure when it is exposed to environmental conditions of interest such as ionizing radiation. In one example, difficulty in conducting environmental testing can arise when a DUT (e.g., a die package) is constructed in such a way that a top side of the die is on the bottom of the package. The top side of the die must be exposed in order for effective ionizing radiation testing. In this example, aperture 51 allows for digital test system to be oriented in such a way that the top side of the die can be exposed to ionizing radiation. The exemplary test system weighs significantly less than the prior art. Certain configurations can weigh less than fifty pounds. An ideal digital test system 1 can weigh under five pounds, some versions even going below two pounds in weight.

The digital test system shown in FIG. 2B has a battery 52 which is used to provide a standby power source for selected components on circuit board 50 via a standby power bus (not shown). For example the standby power bus can be coupled to measurement device interfaces (MDI) (73A-F).

Referring to FIG. 2A a diagram of a MDI 73A-F is shown comprising a female 8-pin interface structure. The measurement devices have corresponding male pins (not shown) which insert into the female interface structure. In one embodiment female 8-pin interface structure first pin position 74A is coupled to 2.5-volt power module 74D. Second and third pin positions 74B and 74C are coupled to an I2C interface bus (not shown). Fourth pin position 74D is coupled to ground (not shown). Fifth pin position 74E is coupled to battery 52. Sixth pin position 74F is coupled to 5-volt power source 53. Seventh and eighth pin positions 74G and 74H are coupled to FPGA 67 for general purpose I/O use.

The digital test system shown in FIG. 2B allows for a variety of measurement devices to be coupled to MDI 73A-H. For example, MDI 73A can couple to a light sensor (not shown), MDI 73B can couple to temperature sensor (not shown), MDI 73C can couple to a humidity sensor (not shown), MDI 73D can couple to a magnetic field sensor (not shown) (e.g., a digital compass), MDI 73E can be coupled to an accelerometer (not shown), and MDI 73F can be coupled to a real-time clock (not shown). Environmental variables can impact radiation data and are important variables to record during a test. Environmental sensors will enable a user of the invention to record all significant environmental variables at the time a test occurs.

Also shown in the embodiment in FIG. 2B is a Bayonet Neill-Concelman (BNC) connection for a 5-volt power supply 53. In one example, BNC connection for a 5-volt power supply 53 is coupled to a driver (not shown) for RS232 serial port 59, MDIs 73A-F, and power modules 54A-E. In another example, power modules 54A-E are coupled to FPGA I/O voltage select 55. In this embodiment FPGA I/O voltage select 55 sets the maximum voltage of user I/O 80A-E and 81A-F.

The embodiment in FIG. 2B also includes external processing system interfaces 56, 57, 59, 61, 63. One embodiment includes a BNC RS232 receive connection 56 and a BNC RS232 transmit connection 57. In one example, BNC RS232 receive and BNC RS232 transmit connections 56 and 57 are coupled to the driver for RS232 serial port 59. An exemplary digital test system 1 further includes RS232 serial port which is coupled to FPGA 67 via a driver (not shown). Another embodiment includes USB port 61 and an Ethernet port 63 which are individually coupled to FPGA 67 via corresponding drivers (not shown). Exemplary external processing system interfaces (56, 57, 59, 61, 63) allow users to interact with digital test system 1 using a personal computer (not shown).

The exemplary digital test system 1 shown in FIG. 2B also comprises a DIMM receptacle 65. In one embodiment DIMM receptacle 65 is configured to hold PC100 or PC133 DIMM. This module can be connected to the FPGA 67 and will allow for 512 MB or 1 GB synchronous dynamic random access memory (DRAM) modules to be added. This additional memory can then be used during testing to store data such as test conditions (also known as test vectors) and experimental data.

An exemplary digital test system 1 can also include 80 MHz oscillator 75 and 200 MHz oscillator 77. One example includes a PROM system 79 which includes a PROM IC chip (not shown), push button (not shown), and FPGA programming interface connector (not shown).

The exemplary digital test system 1 of FIG. 2B further includes user I/O interfaces (80A-E, 81A-F). In one example, five of these user I/O interfaces are coupled to SMA connectors 80A-E. Additional user I/O interfaces 81A-F are coupled to other headers. These exemplary I/O ports can be set to operate at a variety of voltage levels such as: 1.2V, 1.5V, 1.8V, 2.5V, and 3.3V. These I/O may also be configurable to toggle at frequencies of over 300 MHz. An exemplary digital test system 1 further comprises user programmable buttons 83A-B. Another example of the device includes LEDs 87A-C. In one embodiment, LEDs 87A-C can be used to indicate the status of a device test or display the active test mode. In one example of the digital test system 1, there is an I2C sniffer 91 and HLDs 93A-B.

Figure 3:
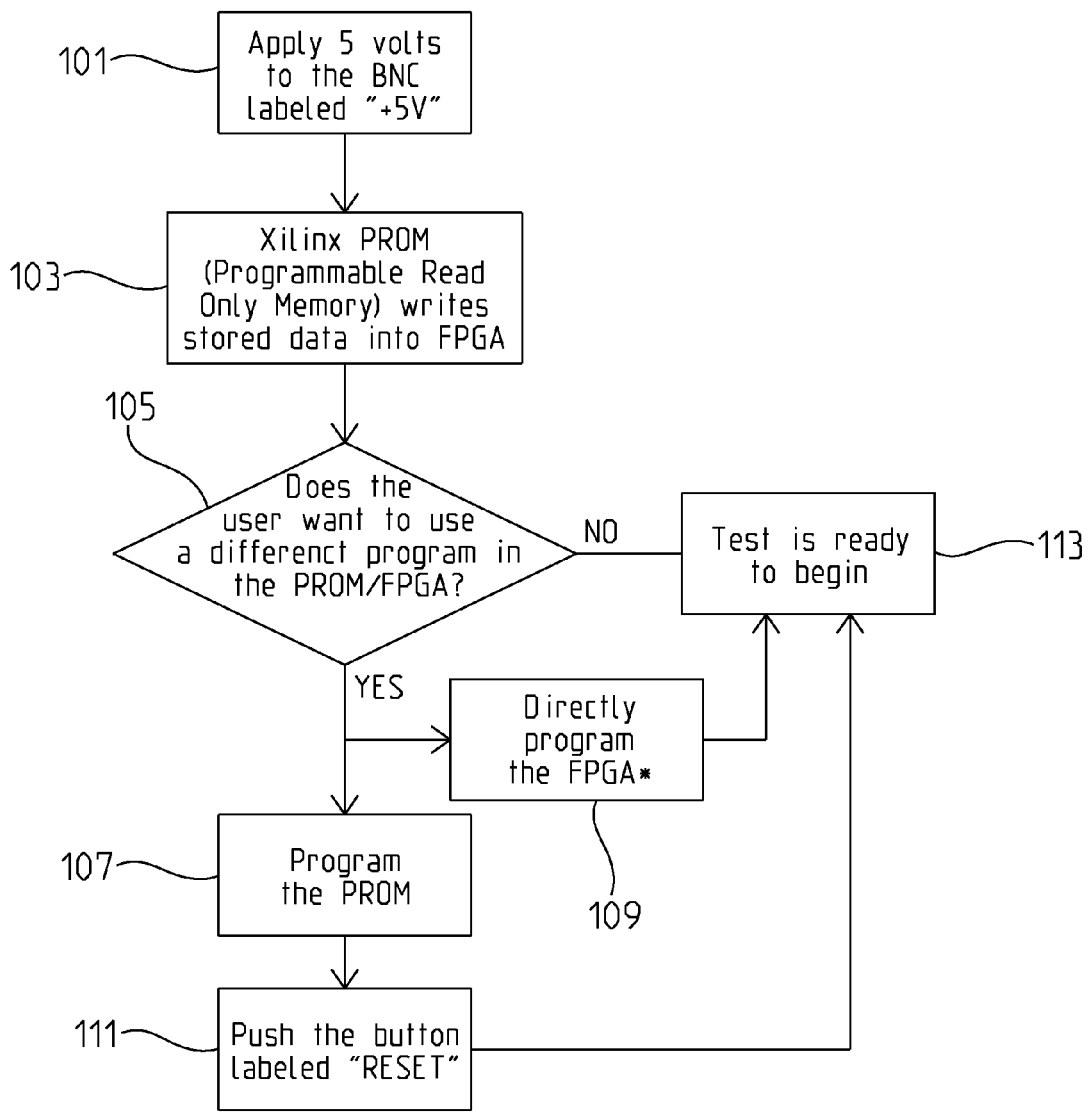
FIG. 3 is a flowchart of one embodiment's steps for initialization of the digital test system.

Referring now to FIG. 3, an exemplary embodiment of a flowchart illustrating the initialization of the digital test system is shown. Five volts are applied through the power supply BNC connection labeled "+5V" (block 101). At system start-up, the PROM writes stored system data onto the FPGA (block 103). Next, the user must determine whether to use a different program in the PROM/FPGA (block 105). In the case that the user elects to utilize the same program that was already loaded into the PROM/FPGA the system is ready to begin tests (block 113). In the alternative situation in which the user elects to utilize a program different from the one stored in the PROM/FPGA, the user has two options. First, the user may reprogram the PROM (block 107) and press the reset button (block 111). Upon pressing the reset button, the new program stored in the PROM is written onto the FPGA and the system is initialized for testing. The second option is if the user elects to directly program the FPGA (block 109). The system will then be ready for testing (block 113), but the data in the FPGA will be lost after the completion of a power cycle.

Figure 4:
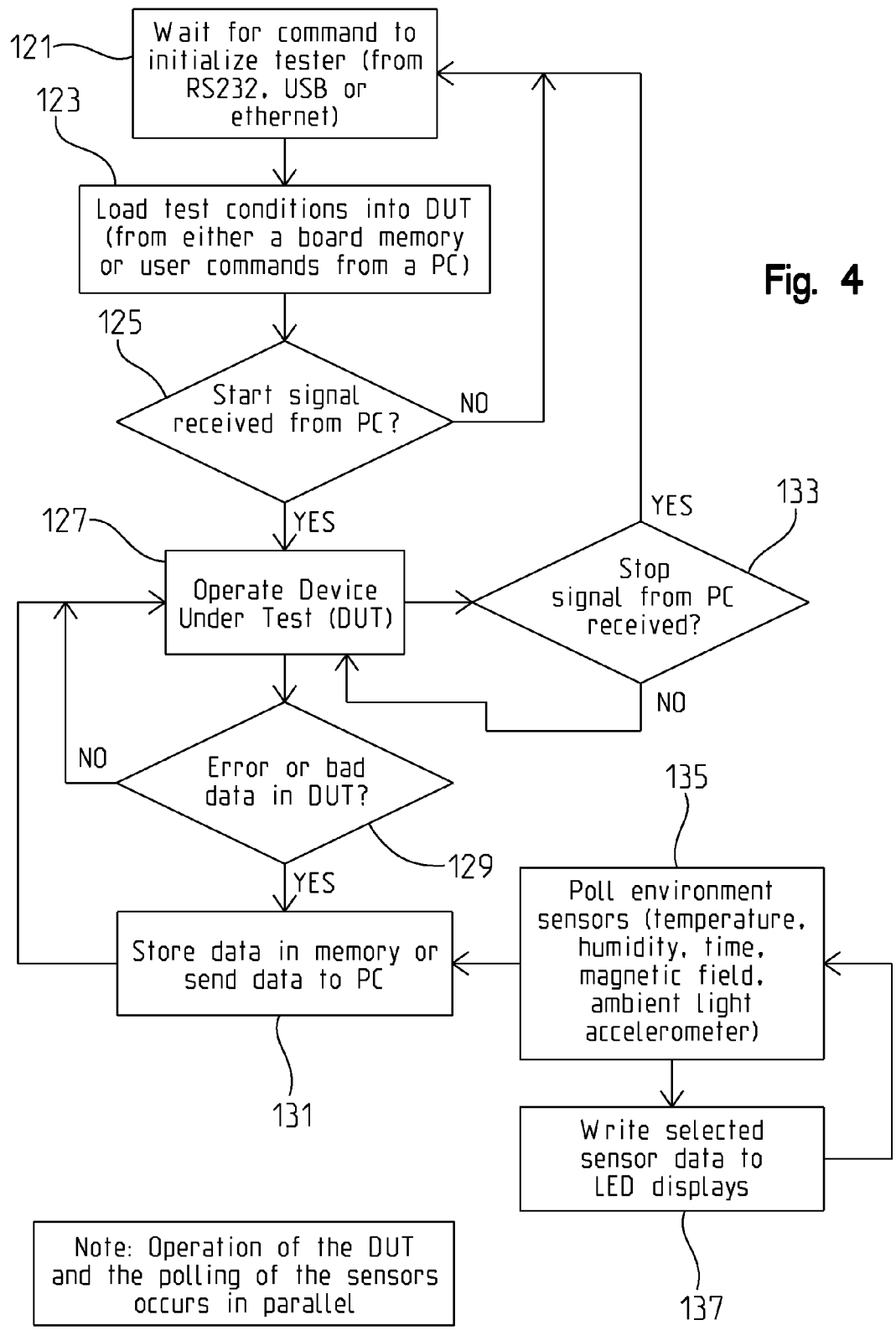
FIG. 4 shows an exemplary software flowchart for the field programmable gate array (FPGA) very high speed integrated circuit hardware description language (VHDL)

The flow chart in FIG. 4 is one example of a software flowchart for the FPGA very high speed integrated circuit hardware description language (VHDL). On start-up, the system awaits a command from the RS232, USB, or Ethernet port to initialize the tester (block 121). The test conditions are loaded into DUT from either the onboard memory or user commands from a PC (block 123). The system then awaits a PC signal to begin testing (block 125). If no signal is received, the system returns to waiting for an initialization command (block 121). In the case that a signal to begin testing is received, the DUT is operated (block 127) and an error/data check is performed (block 129). In the case that an error is found or the data is bad, the data is stored in memory and/or sent to an attached PC (block 131). If there is no error, the device continues operation (block 127) and the error/data check (block 129) continue looping until a stop signal from the PC is received (block 133). When the stop signal is received, the system returns to the state of awaiting an initialization command (block 121). While the DUT is being operated, the environmental sensors are continuously polled (block 135) and selected data from these sensors are written to LED displays (block 137). The data from the environmental sensors is then stored in memory and/or sent to an attached PC (block 131).

Figure 5:
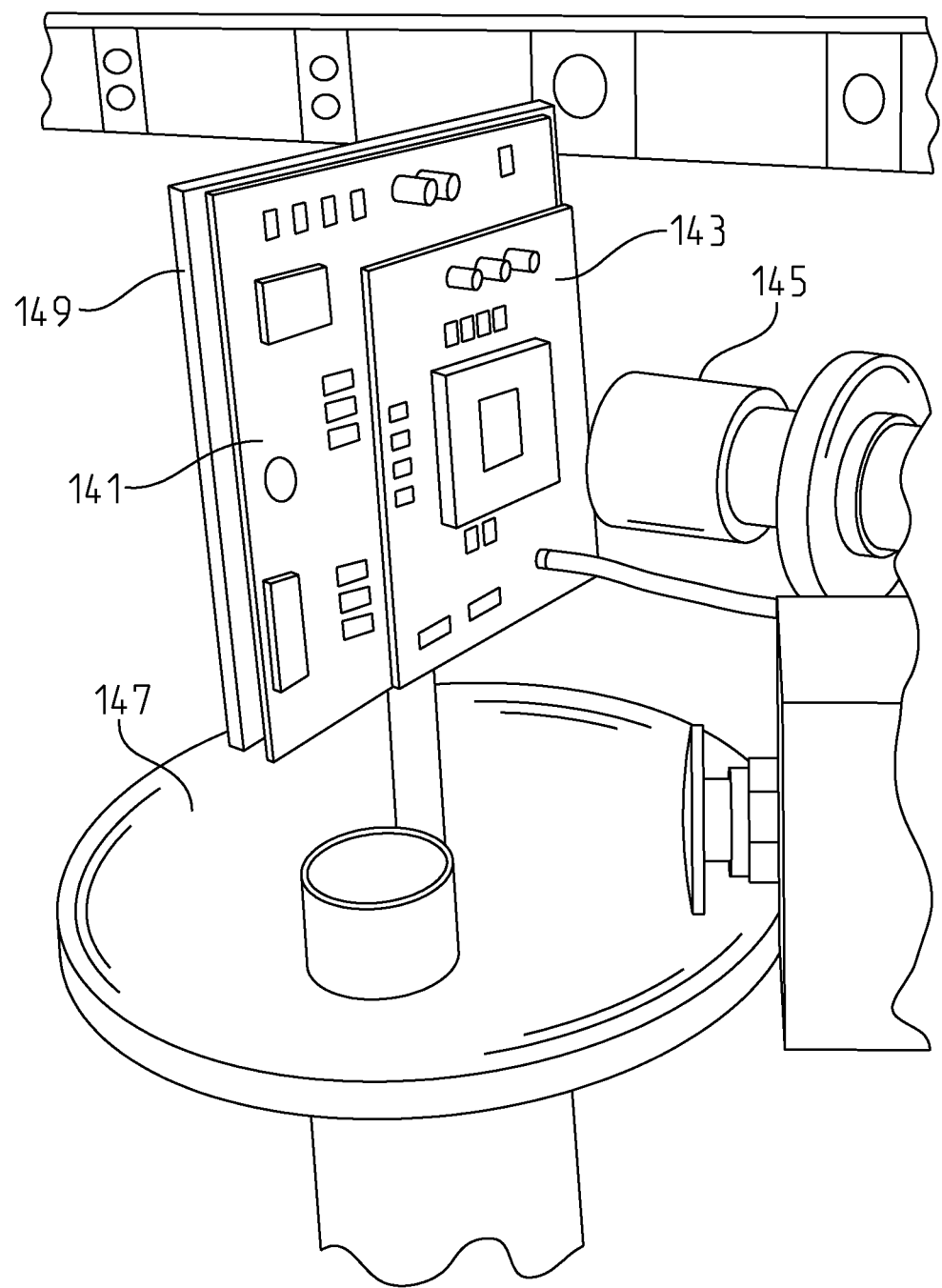
FIG. 5 is one example of a digital test system set up in a test environment.

FIG. 5 shows an exemplary digital test system 141 electrically coupled to DUT 143. In one example, DUT 143 may be coupled to digital test system 141 via a rotatable mounting structure (not shown) which allows the DUT 143 to rotate relative to digital test system 141 while remaining electrically coupled to digital test system 141. Also shown in this example is a radiation source 145 for irradiating DUT 143 and mounting apparatus 149 for mounting digital test system 141 and connected DUT 143 in a position in line with radiation source 145. In this example, mounting apparatus 149 is coupled to rotatable table 147 which allows the mounted digital test system 141 and DUT 143 to be positioned at predetermined angles relative to the irradiation emitted from radiation source 145. An exemplary rotatable table 147 is operated via a remote control (not shown). Other embodiments can have rotatable table 147 operated by a hand crank. In another configuration, rotatable table 147 can be operated via a chip on rotatable table 147 that communicates with an FPGA (not shown) on digital test system 141, allowing test software to set angle of incidence of radiation from radiation source 145. An exemplary mounting apparatus 149 is adapted to movably hold and orient the DUT 143 and digital test board 141 with respect to radiation source 145. An ideal mounting apparatus 149 is configured to allow the position of digital test system 141 to be adjusted in both horizontal and vertical directions. In one configuration, mounting apparatus 149 has a mounting frame which couples to digital test system 141. In one example, mounting apparatus 149 is designed such that digital test system 141 can be mounted in multiple directions, allowing a die package (not shown) on the DUT 143 to be positioned in such a way that die package is in a direct path of radiation from radiation source 145.

Figure 6:
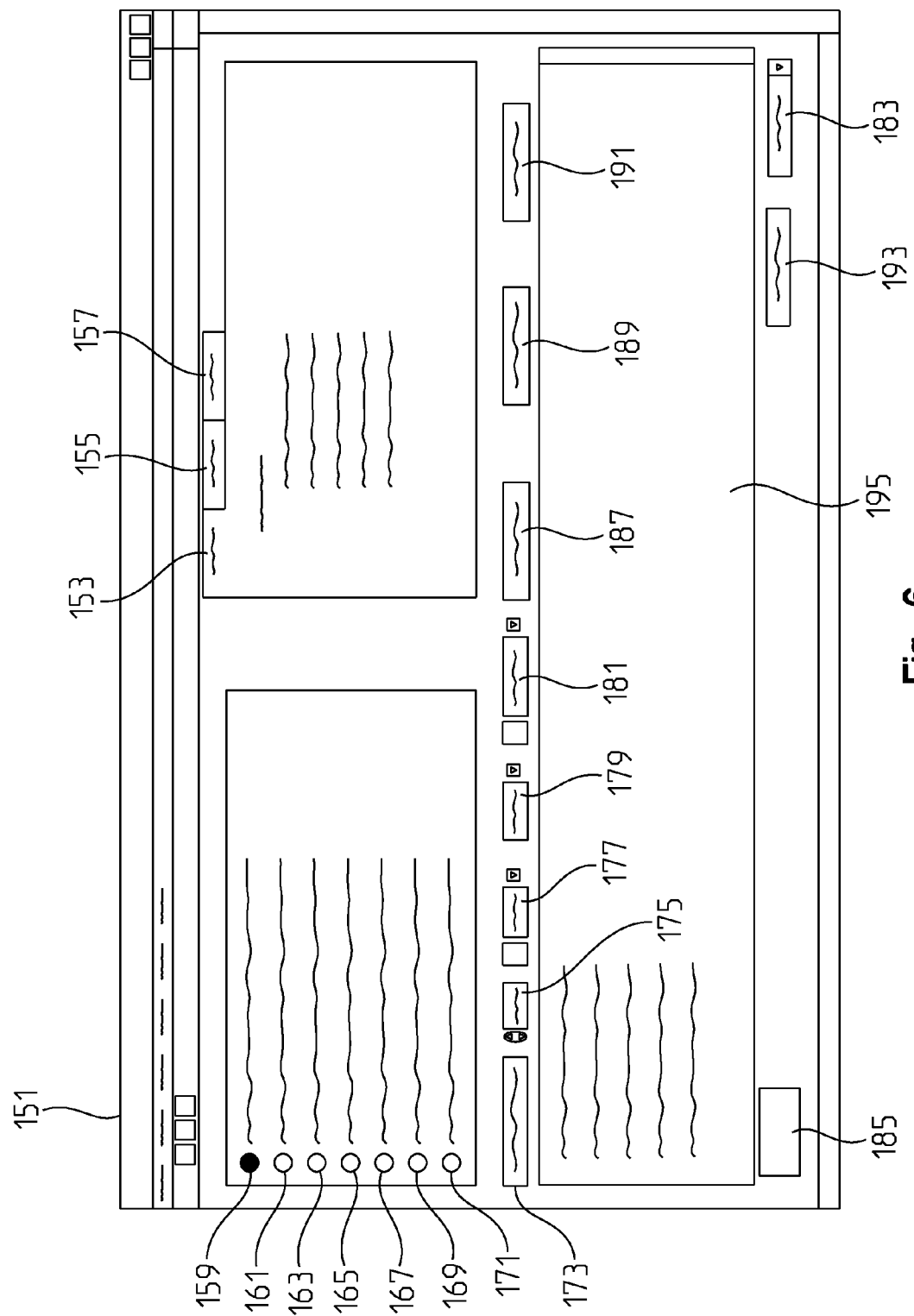
FIG. 6 shows one embodiment of a graphical user interface (GUI) for an external device to control the testing process.
Figure 6A:
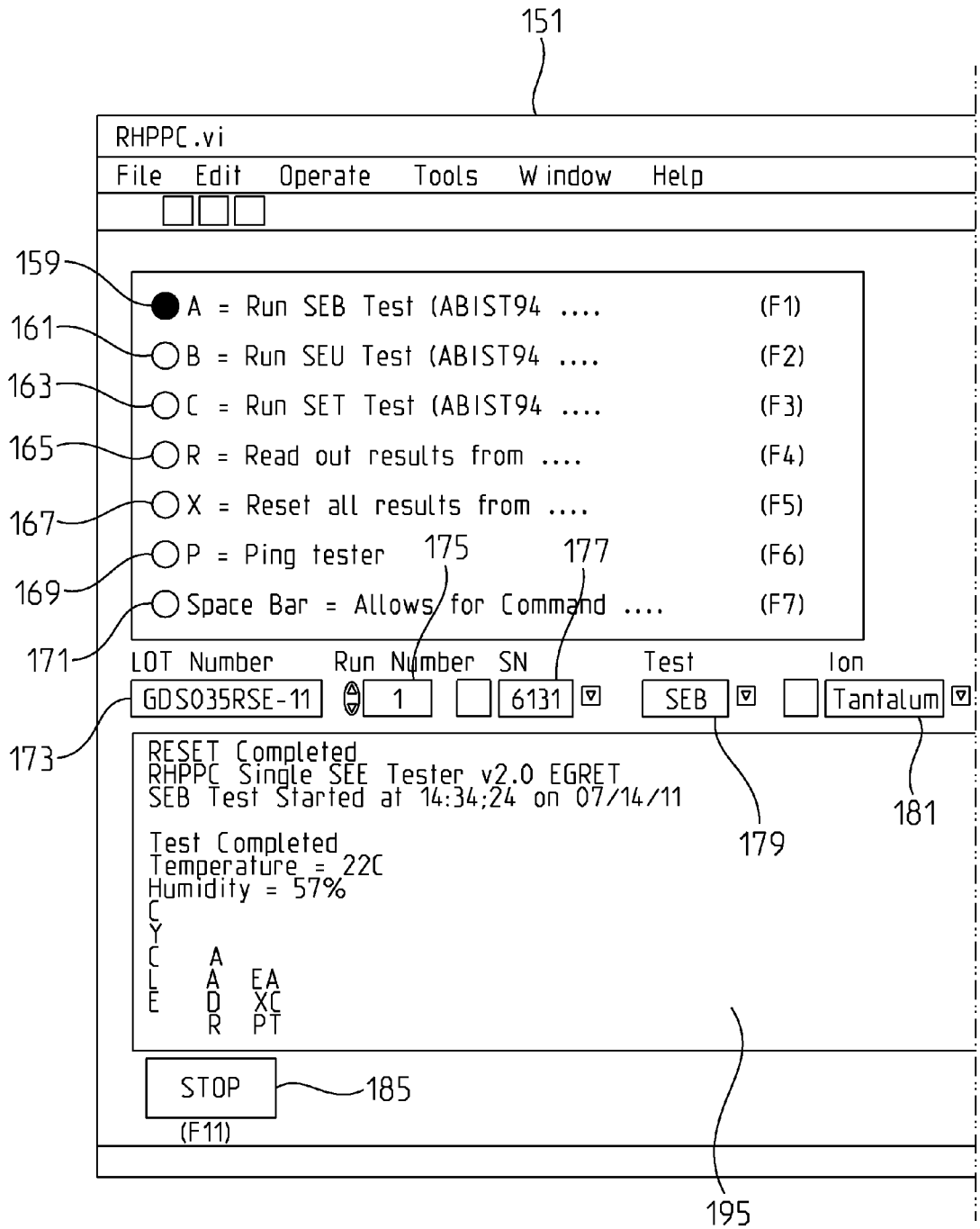
FIG. 6A is a first detailed view of the exemplary GUI of FIG. 6.
Figure 6B:
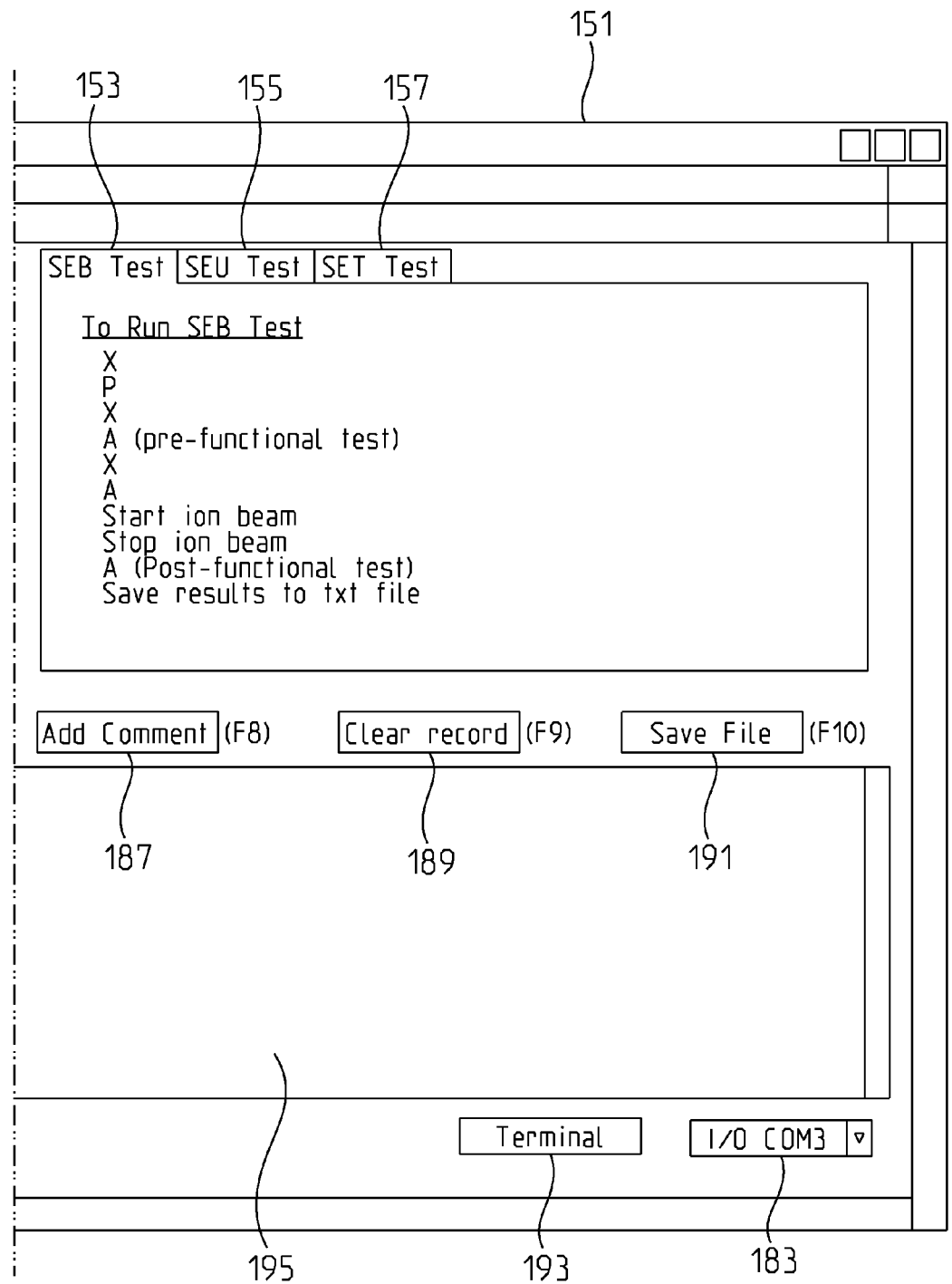
FIG. 6B is a second detailed view of the exemplary GUI of FIG. 6.

FIGS. 6-6B show one embodiment of a graphical user interface 151 (GUI) for an external device to control the testing process. An exemplary GUI 1 includes tabs 153, 155, 157 that display proper sequences of test commands. Another example includes a series of radio buttons 159, 161, 163, 165, 167, 169, 171. These commands can be inputted by alpha-numeric keyboard entry and/or push button via mouse click. In one embodiment, radio button 159 runs a single event burnout (SEB) test, radio button 161 runs a single event upset (SEU) test, radio button 163 runs a single event transient (SET) test, radio button 165 reads out the results from a test, radio button 167 resets the results from the test and reinitializes the tester, radio button 169 pings the tester, and radio button 171 allows for a command to be executed again. One example includes dropdown menus 173, 175, 177, 179, 181, 183. In one example, dropdown menu 173, selects a LOT number for testing, dropdown menu 175 selects a test run number, dropdown menu 177 selects a part serial number, dropdown menu 179 selects a test type, dropdown menu 181 selects what ion type is used in irradiation process, and dropdown menu 183 selects which user I/O is used. An exemplary GUI 151 further includes push buttons 185, 187, 189, 191, 193. In one embodiment, push button 185 is configured to start and stop the test procedure, push button 187 is configured to allow user to insert a comment into display window 195, push button 189 clears the record, push button 191 saves the test file, and push button 193 selects the terminal.

Figure 7:
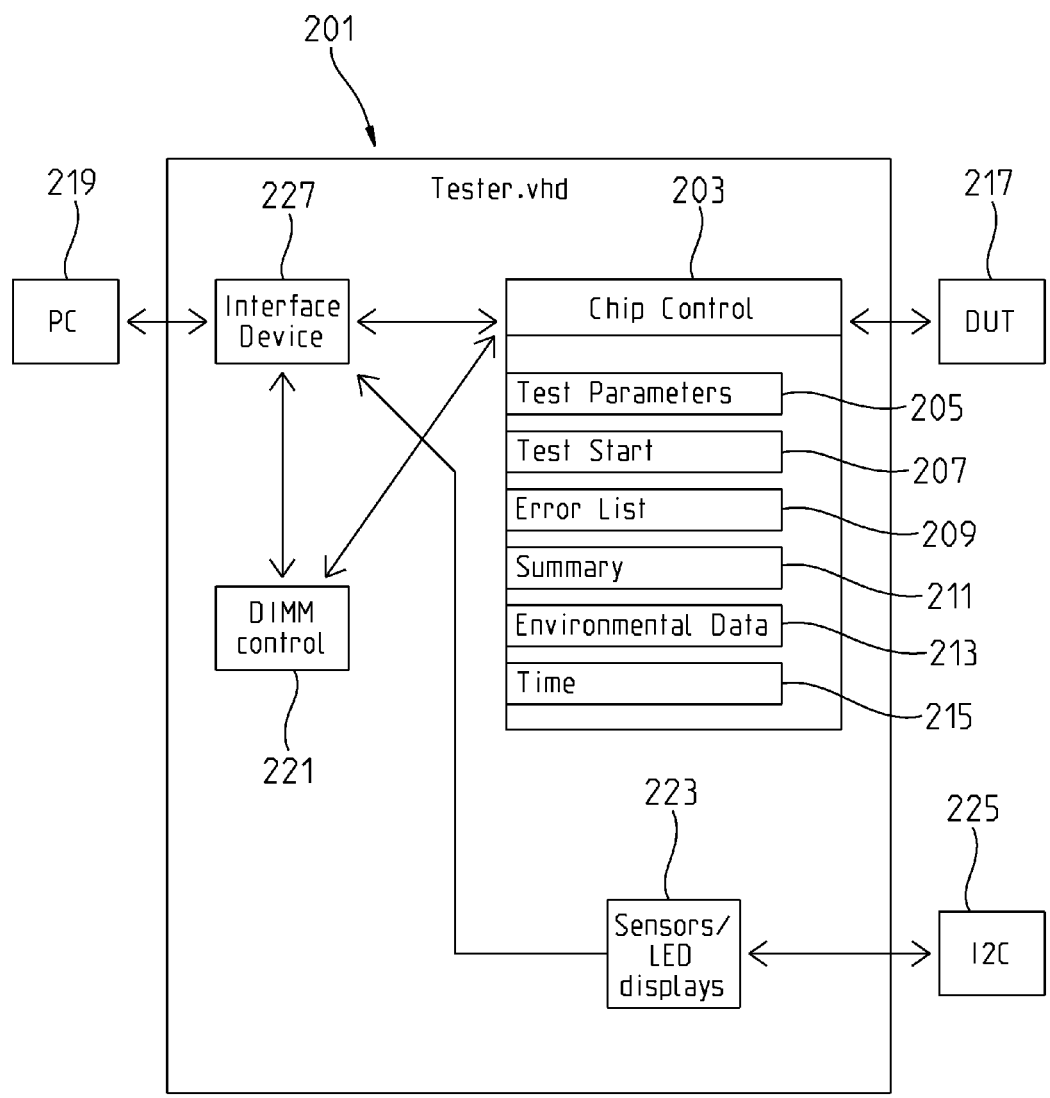
FIG. 7 shows an exemplary functional block diagram of a configuration file for field programmable gate array (FPGA)

FIG. 7 shows an example of a functional block diagram of a configuration file 201 for FPGA (not shown). An exemplary configuration file 201 contains a chip control function 203 that sends signals to DUT 217. In one example, chip control function 203 includes a header 205 that describes the various test parameters. The chip control function 203 also includes a test start line 207, a list of errors 209, a result summary of errors 211, environmental data 213, and time stamp 215. The test sequence contains a set of expected outputs which are compared the actual outputs from the DUT 217 and a list of errors is created. One example of configuration file 201 also includes a interface device function 227 that communicates between PC 219, chip control function 203, and a DIMM control function 221. The interface device function 227 can interface via RS232, Ethernet, and/or USB port. An exemplary DIMM control function 221 stores data from the chip control function 203 and also communicates with PC 219 via interface device function 227. An exemplary configuration file 201 further includes sensor and LED display function 223, which communicates with PC 219 through interface device function 227 and with I2C bus 225.

Referring now to FIG. 8A, an example of outputs from the digital test system are shown. An exemplary set of outputs includes a header 231 which describes the test conditions associated with the particular type of radiation testing used during the associated test run. In one example, test parameters included in header 231 include the time and date of the test initialization, environmental data, and type of device being subjected to irradiation. One example of outputs further includes a timestamp 233 showing the time of commencement of the test procedure. In one embodiment, the outputs from the digital test system include a list of errors 235. The test procedure works by comparing expected outputs to actual outputs. Where these outputs do not match, an error is created and added to this outputted list of errors 235.

FIG. 8B is an additional example of outputs from the digital test system. In this example a list of errors 237 that are a result of the comparison between expected results and actual results from the DUT (not shown) during radiation testing. An exemplary output includes a summary of results 239. An ideal summary of results 239 lists the number of each type of various errors that can be detected during the particular test procedure. One example of outputs from the digital test system further includes environmental data 241. Ideal environmental data 241 will include data from environmental sensors (not shown) on digital test system such as temperature and humidity. An exemplary set of outputs from the digital test system also includes a timestamp 243 indicating the end of the test procedure.

Figure 9:
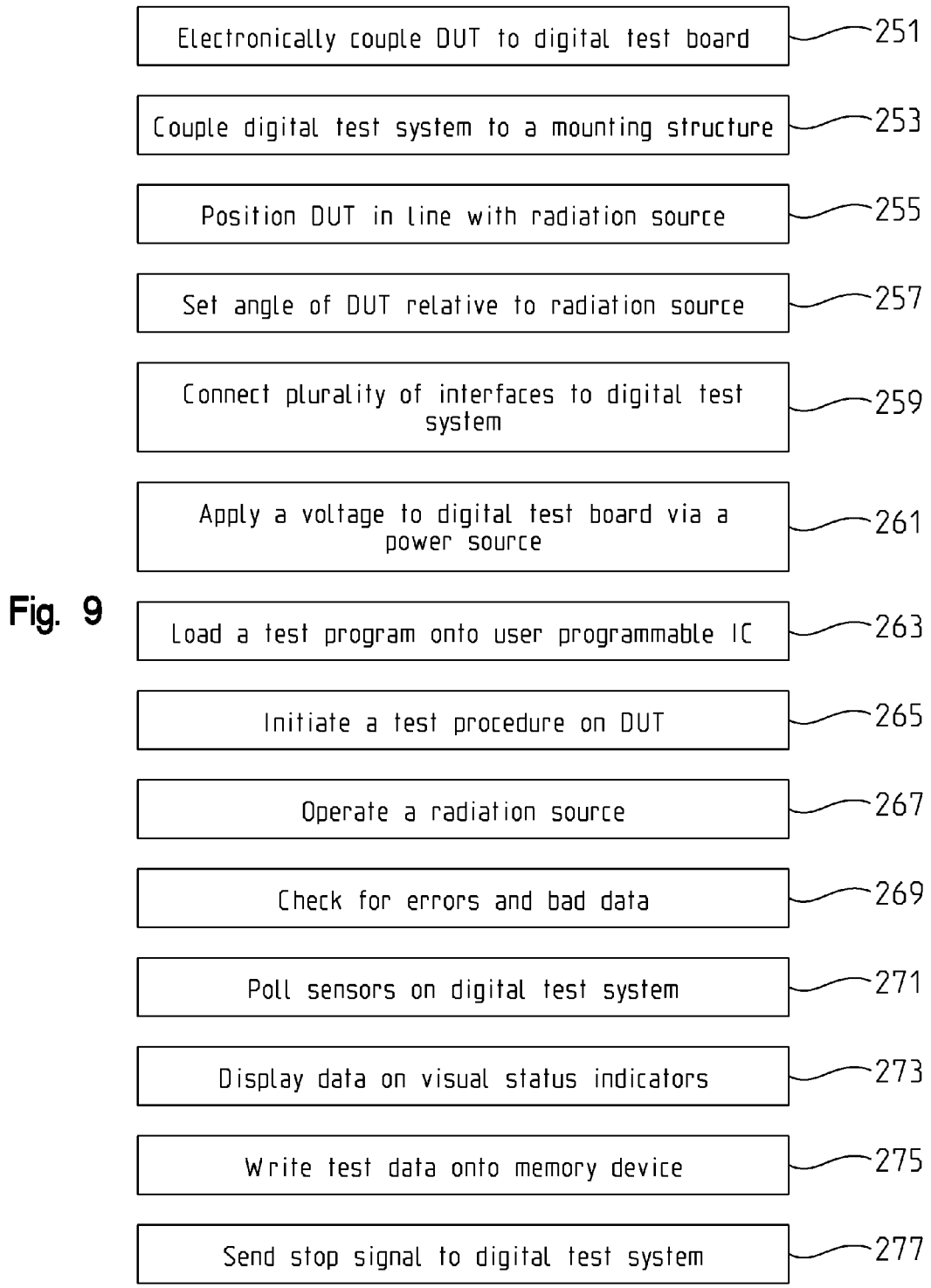
FIG. 9 shows an exemplary list of steps for using digital test system.

FIG. 9 shows an exemplary method set of steps for using the digital test system. One example of steps includes electrically coupling 251 a DUT to the digital test board. In one embodiment, electrically coupling includes rotating the DUT relative to the digital test system. In one example, rotating the DUT can be done by plugging it in to symmetrical inputs (not shown) on the digital test system. In another embodiment, rotating the DUT can be accomplished by coupling it to the digital test system via a rotatable mount (not shown) positioned on the digital test system. An exemplary set of steps for using digital test system further includes coupling the digital test system to a mounting structure 253. The coupling of the digital test system to a mounting structure 253 can involve using a clamping device (not shown) on the mounting structure to hold the digital test system in place. In another embodiment the coupling of the digital test system to a mounting structure 253 can involve fastening the digital test system to a mounting structure backing, wherein the mounting structure backing includes an aperture such that when the digital test system and DUT are positioned on the far side of the mounting backing relative to a radiation source there is a direct path for radiation to reach the DUT.

The exemplary set of steps shown in FIG. 9 for using the digital test system includes positioning the DUT in line with the radiation source 255. Positioning the DUT in line with the radiation source 255 can be done by adjusting the horizontal and vertical position of the digital test system within the mounting structure. In one embodiment, there is a step for setting the angle of the DUT relative the radiation source 257. One example of setting the angle of the DUT relative to the radiation source 257 involves operating a rotatable table coupled to the mounting device in order to set the effective angle of the DUT relative to the radiation source. The rotatable table can be fully rotated in order for the backside of the DUT to be directly exposed to the radiation from the radiation source. In one example, using the digital test system includes the step of connecting a plurality of interfaces to the digital test system 259. One embodiment of connecting a plurality of interfaces to the digital test system 259 can include electrically coupling a power source and an external PC to the digital test system.

The embodiment of steps for using the digital test system in FIG. 9 further includes the step of applying a voltage to the digital test system 261 via a power source. Another embodiment includes a step of loading a test program onto a user programmable IC 263. In one example loading a test program onto a user programmable IC 263 involves directly programming a user programmable IC, such as an FPGA or ASIC chip, via an external computer interface. Another configuration involves loading a test program onto a user programmable IC 263 by sending a signal to a PROM on the digital test system to load a stored test program onto the user programmable IC. In one example, the steps for using the digital test system include initiating a test procedure on the DUT 265. In one embodiment, initiating a test procedure on the DUT 265 involves pressing a push button on the digital test system that is programmed to signal the FPGA to run a test sequence. In another example, initiating a test procedure on the DUT 265 involves sending a signal to the FPGA via an external PC, having a GUI designated for running test procedures.

The exemplary steps shown in FIG. 9 also include operating a radiation source 267. One configuration involves the step of checking for errors and bad data 269. One example of checking for errors and bad data 269 involves software in the FPGA having a set of expected results from the DUT and a set of actual results from the DUT, wherein the two sets of results are compared. Where these outputs do not match, an error is detected and entered into an output file on an external PC. In one embodiment, the steps further include polling sensors on the digital test system 271. Polling the sensors on the digital test system 271 in one example involves reading and storing data from environmental sensors located on the digital test system. Another configuration includes the step of displaying data on visual status indicators 273. In one example displaying data on visual status indicators 273 includes displaying a bimodal status by lighting an LED. In one embodiment, displaying data on visual status indicators 273 further involves displaying environmental variables on Hexadecimal LEDs. One example includes a step of writing test data onto a memory device 275. An exemplary step of writing test data onto a memory device 275 includes writing data onto a memory device, such as DIMM, that is coupled to the digital test system. In another configuration, writing test data onto a memory device 275 can be done by transmitting the data via an interface connector to an external device such as a PC to be written onto the external device. An exemplary set of steps for using the digital test system further includes sending a stop signal to the digital test system 277 in order to end the test sequence.

The set of steps in FIG. 9 can be repeated in whole or in part, in any order in accordance with particular user test procedure requirements. The digital test system can also be used in a method of manufacture of an electronic device, wherein an exemplary method involves the step of assembling an electronic device or subassembly or component of such electronic device. One example of a method for manufacture of an electronic device further includes steps shown in FIG. 9 and described above.

Although the disclosure has been described in detail with reference to certain preferred embodiments, variations and modifications exist within the spirit and scope of the disclosure as described and defined in the following claims.

The invention claimed is:

1. A method of testing a device, comprising the steps:
   selectively mounting a device under test (DUT) comprising an integrated circuit (IC) and a first DUT interface structure to a circuit board comprising an aperture and a second DUT interface structure adjacent to said aperture configured to selectively couple with said first DUT interface structure in manner as to orient a first side of said DUT to be exposed or subject to direct exposure from a radiation source;
   aligning said circuit board with said radiation source by mounting said circuit board to a mounting structure and adjusting a height and angle of the mounting structure;
   applying a voltage to the circuit board and DUT via a power source wherein said voltage is selected using a voltage select system coupled to a plurality of power modules on the circuit board which are powered by the power source;
   loading a test program into an IC on said circuit board by pressing a button in a programmable read only memory (PROM) system coupled to said circuit board to load said test program from a PROM memory in said PROM system onto said IC;
   providing said radiation source configured to emit radiation;
   positioning said DUT such that a second side of said DUT having said IC is subject to direct exposure from said radiation source via an aperture in said circuit board;
   operating said radiation source to direct the radiation through said aperture and into said DUT;
   selecting a test procedure comprising a plurality of test sequences configured to operate said IC to execute a plurality of functions on the IC via a user input on a graphical user interface (GUI) on a computer coupled to said IC via an interface connector on said circuit board;
   initiating the test procedure via another user input into said GUI that causes the computer to send an initialization signal and test program execution signal from said computer to said IC through said interface connector on said circuit board;
   operating the DUT based on said test procedure and said test program;
   polling sensors on the circuit board to gather environmental data;
   checking for errors and bad data on the DUT by comparing expected results with actual results from said test procedure;
   displaying an error list, summary of errors, and environmental data in a display window on said GUI;
   writing test data onto a dynamic random access memory (DRAM) memory device housed within a dual in-line memory module (DIMM) receptacle on said circuit board;
   sending a stop signal to said IC via said GUI generated by computer and said interface connector.

2. The method of claim 1, wherein the writing data step further comprises writing data onto an external device via a data interface connector.

3. The method of claim 1 wherein said circuit board further comprises an appliance or socket for selectively coupling and decoupling said IC with said circuit board.

4. The method of claim 3 further comprising electrically coupling said appliance or socket to said DUT and said interface connector.

5. A method of testing a device comprising:
   providing a computer configured to run a plurality of test processing sequences comprising a first test processing sequence and a second test processing sequence, wherein said first test processing sequence provides a graphical user interface (GUI) that provides inputs for selecting and commencing test sequences, provides a selection for a radiation source, and outputs test results and environmental data, and said second test processing sequence is configured to compare actual results of a test procedure to expected results of a test procedure;

providing a circuit board coupled to said computer, said circuit board having an aperture;

positioning an interface connector for coupling to a device under test (DUT) comprising an integrated circuit (IC) under test (ICIT) such that when said DUT is coupled to said interface connector, a back side of said DUT with said ICIT is configured to be accessible or exposed to direct radiation from a radiation source through said aperture;

providing a programmable IC on said circuit board;

providing a plurality of signal buses coupled to said programmable IC;

coupling a plurality of signal interface connectors to said programmable IC, including a first interface connector, a second interface connector, a third interface connector, and a fourth interface connector, wherein said first interface connector is a RS232 connector, said second interface connector is an Ethernet connector, said third interface connector is a universal serial bus (USB) connector, said fourth interface connector is a SubMiniature version A (SMA) connector;

providing a plurality of power interface sections including a first power interface section and a second power interface section, wherein said first power interface section is a connector configured to apply power from an external power source to the circuit board via a power bus, and said second power interface section is a battery that supplies power to components of the circuit board via a power bus;

coupling a plurality of power modules coupled to a first power interface section and a voltage selector switch to said programmable IC in order to set the level of voltage delivered to the circuit board;

providing a first memory device coupled to said programmable IC;

providing a second memory device comprising a programmable read only memory (PROM) coupled to said programmable IC;

coupling a process timing control section comprising a plurality of clock signal generators to said programmable IC;

providing a plurality of display sections coupled to said programmable IC comprising a first display section and a second display section, wherein said first display section includes a plurality of light emitting diodes (LED) and said second display section includes a plurality of hexadecimal LEDs (HLED);

coupling a plurality of push button electro-mechanical switches with said programmable IC configured to selectively apply electrical signals to one or more input pins of said programmable IC;

providing a plurality of sensors coupled to said programmable IC which are configured to gather environmental data comprising a first sensor, a second sensor, a third sensor, a fourth sensor, a fifth sensor, and a sixth sensor, wherein said first sensor is a thermometer, said second sensor is a real-time clock, said third sensor is adapted to detect light, said fourth sensor is a hygrometer, said fifth sensor is a magnetic field sensor, and said sixth sensor is an accelerometer;

coupling a bus analyzer to one of said signal buses;

providing and storing a plurality of processing functions stored and run on said programmable IC comprising a first process control section or instructions and a second process control section or instructions, wherein said first process control section or control instructions controls a test procedure for said DUT and said ICIT, said second process control section or instructions polls the plurality of sensors to gather environmental data of said DUT during said test procedure;

providing said radiation source configured to emit said radiation through said aperture and onto said ICIT;

selecting and executing said first and second test processing sequences which then execute said first and second control section or instructions using said GUI and operating said DUT and ICIT;

collecting data from said first and second test processing sequences as well as said first and second control section or instructions.

6. The method of claim 5, further comprising the step of providing an appliance adapted to hold said DUT, wherein said appliance comprises a socket with a connector for interfacing with a fifth interface connector on said circuit board.

* * * * *